(12) United States Patent
Lee et al.

(10) Patent No.: US 11,658,499 B2
(45) Date of Patent: May 23, 2023

(54) BATTERY DIAGNOSIS APPARATUS

(71) Applicants: HYUNDAI MOTOR COMPANY, Seoul (KR); KIA CORPORATION, Seoul (KR); FOUNDATION OF SOONGSIL UNIVERSITY—INDUSTRY COOPERATION, Seoul (KR)

(72) Inventors: Bohyun Lee, Incheon (KR); Won Jae Choi, Seoul (KR); Ju Seok Kim, Suwon-si (KR); Jaekyung Oh, Yongin-si (KR); Sangwon Lee, Daegu (KR); Hee Yeon Ryu, Yongin-si (KR); Chulkyu Lee, Anyang-si (KR); Woojin Choi, Seoul (KR); Seungjune Lee, Seoul (KR); Farhan Farooq, Seoul (KR)

(73) Assignees: HYUNDAI MOTOR COMPANY, Seoul (KR); KIA CORPORATION, Seoul (KR); FOUNDATION OF SOONGSIL UNIVERSITY-INDUSTRY COOPERATION, Seoul (KR)

( * ) Notice: Subject to any disclaimer, the term of this patent is extended or adjusted under 35 U.S.C. 154(b) by 0 days.

(21) Appl. No.: 17/535,238

(22) Filed: Nov. 24, 2021

(65) Prior Publication Data
US 2022/0239128 A1 Jul. 28, 2022

(30) Foreign Application Priority Data
Jan. 27, 2021 (KR) ........................ 10-2021-0011173

(51) Int. Cl.
| | |
|---|---|
| *H02J 7/00* | (2006.01) |
| *G01R 31/389* | (2019.01) |
| *G01R 31/392* | (2019.01) |
| *H03F 3/45* | (2006.01) |

(52) U.S. Cl.
CPC .......... *H02J 7/0047* (2013.01); *G01R 31/389* (2019.01); *G01R 31/392* (2019.01); *H02J 7/00032* (2020.01); *H02J 7/0071* (2020.01); *H03F 3/45* (2013.01)

(58) Field of Classification Search
None
See application file for complete search history.

(56) References Cited

U.S. PATENT DOCUMENTS

2005/0021254 A1* 1/2005 Meri ................. G01R 31/389
  702/65
2017/0003354 A1* 1/2017 Morrison .......... G01R 31/3842

* cited by examiner

*Primary Examiner* — Jas A Sanghera
(74) *Attorney, Agent, or Firm* — Lempia Summerfield Katz LLC

(57) ABSTRACT

A battery diagnosis apparatus determines whether a battery may be reused and includes a data obtaining device configured to output a perturbation signal, a signal regulating device configured to generate a current by applying the perturbation signal to a battery and performing feedback of a current signal output from the battery, and a noise canceling device configured to cancel noises of the current signal and a voltage signal received from the battery. The data obtaining device outputs the perturbation signal while changing a frequency, obtains an impedance spectrum based on the noise-canceled current signal and voltage signal for each frequency, and determines whether to reuse the battery based on the obtained impedance spectrum.

17 Claims, 12 Drawing Sheets

BATTERY DIAGNOSIS APPARATUS

CROSS-REFERENCE TO RELATED APPLICATION(S)

This application is based on and claims priority under 35 U.S.C. § 119 to Korean Patent Application No. 10-2021-0011173, filed on Jan. 27, 2021, in the Korean Intellectual Property Office, the disclosure of which is incorporated by reference herein in its entirety.

BACKGROUND

1. Field

The disclosure relates to a battery diagnosis apparatus for determining whether a battery may be reused.

2. Description of the Related Art

Renewable energy sources such as solar power and wind power have a disadvantage in that they may not consistently obtain power depending on the weather. To this end, recently, a system that stores energy in advance in a storage device and uses the energy at a required time has been used. This is called an energy storage system (ESS).

Such an energy storage system may be referred to as a device that efficiently uses electric energy by applying a storage technology to the characteristics of electricity consumed at the same time as production.

A battery is used as a representative medium of the energy storage system. In this case, the battery may be a newly manufactured battery or a battery that is reused after having been used in another device.

When a battery that is reused following use in another device is used as an energy storage system, it is necessary to determine whether the battery is in a reusable state before it is used as the energy storage system. In this case, expensive equipment such as a signal generator and a phase detector and bulky equipment such as a power supply device are required.

SUMMARY

An aspect of the disclosure is to provide a battery diagnosis apparatus capable of determining a residual value of a battery.

Another aspect of the disclosure is to provide a battery diagnosis apparatus capable of measuring an impedance spectrum of a battery based on a perturbation signal and a noise canceling signal for each frequency.

Additional aspects of the disclosure are set forth in part in the description which follows. Further aspects of the disclosure, in part, should be apparent from the description or may be learned by practice of the disclosure.

In accordance with an aspect of the disclosure, a battery diagnosis apparatus includes a data obtaining device configured to output a perturbation signal. The battery diagnosis apparatus also includes a signal regulating device configured to generate a current by applying the perturbation signal to a battery and performing feedback of a current signal output from the battery. The battery diagnosis apparatus also includes a noise canceling device configured to cancel noises of the current signal and a voltage signal received from the battery. The data obtaining device outputs the perturbation signal while changing a frequency, obtains an impedance spectrum based on the noise-canceled current signal and voltage signal for each frequency, and determines whether to reuse the battery based on the obtained impedance spectrum.

The signal regulating device may include a first amplifier provided to amplify the perturbation signal, a switch provided to be turned on by the amplified perturbation signal and induce a current of the battery, and a second amplifier provided to feed back a current signal for the induced current of the battery to the first amplifier.

The switch may include an n-channel MOSFET.

The data obtaining device may control a discharging of the battery for a preset time by turning on the switch for a preset time.

The battery diagnosis apparatus may further include a current detection device configured to detect a current flowing through the battery and transmit the detected current to the noise canceling device. The battery diagnosis apparatus may further include a voltage detection device configured to detect a voltage applied to the battery and transmit the detected voltage to the noise canceling device.

The noise canceling device may include a current noise canceling device configured to cancel a noise from a current signal for the current detected by the current detection device and transmit the noise-canceled current signal to the data obtaining device. The noise canceling device may also include a voltage noise canceling device configured to cancel a noise from a voltage signal for the voltage detected by the voltage detection device and transmit the noise-canceled voltage signal to the data obtaining device.

The current noise canceling device may include a first high-pass filter provided to cancel a DC component of a current signal for the current detected by the current detection device. The current noise canceling device may also include a first low-pass filter provided to cancel a high-frequency noise in the current signal in which the DC component is canceled. The voltage noise canceling device may include a second high-pass filter provided to cancel a DC component of a voltage signal for the voltage detected by the voltage detection device. The voltage noise canceling device may also include a second low-pass filter provided to cancel a high-frequency noise in the voltage signal in which the DC component is canceled.

The current noise canceling device may include a third amplifier connected to the first low-pass filter and a fourth amplifier connected to the first high-pass filter and provided to invert the current signal from which the DC component is canceled and to transmit the inverted current signal to the third amplifier. The voltage noise canceling device may include a fifth amplifier connected to the second low-pass filter and a sixth amplifier connected to the second high-pass filter and provided to invert the voltage signal from which the DC component is canceled and transmit the inverted voltage signal to the fifth amplifier.

The third amplifier may invert the signal transmitted from the fourth amplifier and transmit the inverted signal to the data obtaining device. The fifth amplifier may invert the signal transmitted from the sixth amplifier and transmit the inverted signal to the data obtaining device.

The data obtaining device may include an analog-to-digital converter provided to convert the noise-canceled voltage signal and the noise-canceled current signal into a digital signal.

The data obtaining device may output a perturbation signal of a voltage converted into an analog signal.

The data obtaining device may display information on the impedance spectrum through a Nyquist plot.

In accordance with another aspect of the disclosure, a battery diagnosis apparatus includes a current detection device configured to detect a current flowing through a battery, a voltage detection device configured to detect a voltage applied to the battery, and a monitoring device. The monitoring device is configured to apply a perturbation signal of the voltage to the battery and generate a perturbation signal of the current by performing feedback of a current signal output from the battery. The monitoring device is also configured to cancel noises of a current signal for the current detected by the current detection device and a voltage signal for the voltage detected by the voltage detection device. The monitoring device is also configured to obtain an impedance spectrum based on the noise-canceled current signal and voltage signal. The battery diagnosis apparatus also includes a controller configured to determine whether to reuse the battery based on the obtained impedance spectrum and a display device configured to display a Nyquist plot for the obtained impedance spectrum and information on whether to reuse the battery.

The monitoring device may include a first amplifier provided to amplify the perturbation signal of the voltage, a switch provided to be turned on by the amplified perturbation signal and induce a current of the battery, and a second amplifier provided to feed back a current signal for the induced current of the battery to the first amplifier.

The monitoring device may include a data obtaining device configured to output the perturbation signal of the voltage while changing a frequency and obtain an impedance spectrum based on the noise-canceled current signal and voltage signal.

The monitoring device may include a current noise canceling device configured to cancel a noise from a current signal for the current detected by the current detection device and transmit the noise-canceled current signal to the data obtaining device. The monitoring device may also include a voltage noise canceling device configured to cancel a noise from a voltage signal for the voltage detected by the voltage detection device and transmit the noise-canceled voltage signal to the data obtaining device.

The current noise canceling device may include a first high-pass filter provided to cancel a DC component of a current signal for the current detected by the current detection device. The current noise canceling device may also include a first low-pass filter provided to cancel a high-frequency noise in the current signal in which the DC component is canceled. The voltage noise canceling device may include a second high-pass filter provided to cancel a DC component of a voltage signal for the voltage detected by the voltage detection device. The voltage noise canceling device may also include a second low-pass filter provided to cancel a high-frequency noise in the voltage signal in which the DC component is canceled.

The current noise canceling device may include a third amplifier connected to the first low-pass filter and a fourth amplifier connected to the first high-pass filter and provided to invert the current signal from which the DC component is canceled and transmit the inverted current signal to the third amplifier. The voltage noise canceling device may include a fifth amplifier connected to the second low-pass filter and a sixth amplifier connected to the second high-pass filter and provided to invert the voltage signal from which the DC component is canceled and transmit the inverted voltage signal to the fifth amplifier.

The third amplifier may invert the signal transmitted from the fourth amplifier and transmit the inverted signal to the data obtaining device. The fifth amplifier may invert the signal transmitted from the sixth amplifier and transmit the inverted signal to the data obtaining device.

BRIEF DESCRIPTION OF THE DRAWINGS

These and/or other aspects of the disclosure should become apparent and more readily appreciated from the following description of the embodiments, taken in conjunction with the accompanying drawings of which.

DETAILED DESCRIPTION

Figure 1A:
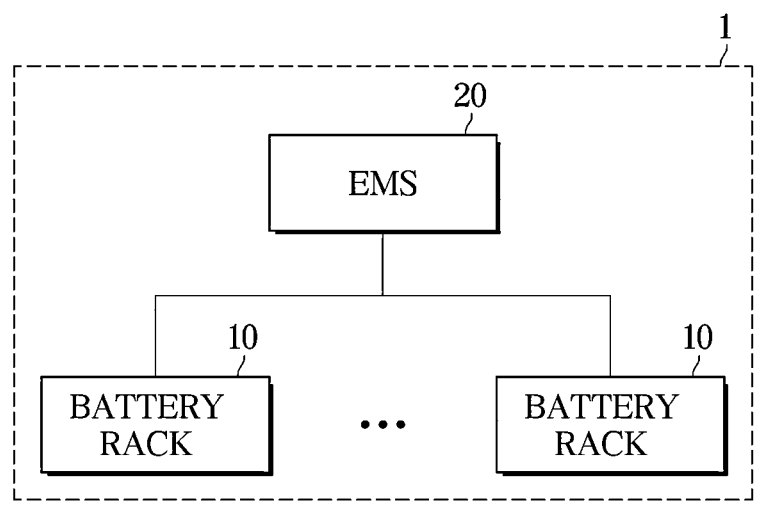
FIG. 1A is a diagram of a battery energy storage system according to an embodiment.

Throughout the specification, like reference numerals refer to like elements. This specification does not describe all the elements of the embodiments, and duplicative contents of general contents or embodiments in the technical field of the disclosure have been omitted. The terms 'part,' 'module,' 'member,' and 'block' used in this specification may be embodied as software or hardware, and it is also possible for a plurality of 'parts,' 'modules,' 'members,' and 'blocks' to be embodied as one component, or one 'part,' 'module,' 'member,' and 'block' to include a plurality of components according to embodiments. When a 'part,' 'module,' 'member,' 'block,' or the like of the present disclosure is described as having a purpose or performing an operation, function, or the like, the 'part,' 'module,' 'member,' 'block,' or the like should be considered herein as being "configured to" meet that purpose or to perform that operation or function.

Throughout the specification, when a part is referred to as being "connected" to another part, it includes not only a direct connection but also an indirect connection, and the indirect connection includes connecting through a wireless network.

Also, when it is described that a part "includes" an element, it means that the element may further include other elements without excluding the other elements unless specifically stated otherwise.

The terms 'first,' 'second,' etc. are used to distinguish one element from another element, and the elements are not limited by the above-mentioned terms.

The singular forms "a," "an," and "the" include plural referents unless the context clearly dictates otherwise.

In each step, an identification numeral is used for convenience of explanation, the identification numeral does not describe the order of the steps, and each step may be performed differently from the order specified unless the context clearly states a particular order.

Hereinafter, the disclosure is described in detail with reference to the accompanying drawings.

Figure 1B:
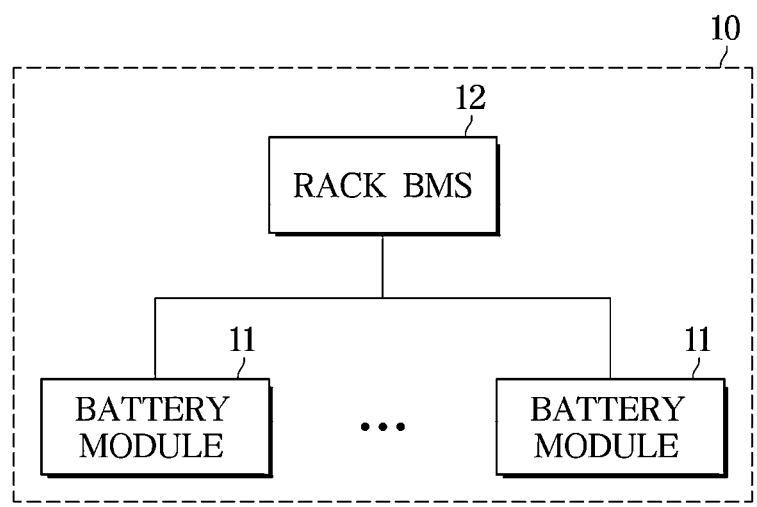
FIG. 1B is a diagram of a battery rack in the energy storage system illustrated in FIG. 1A.
Figure 1C:
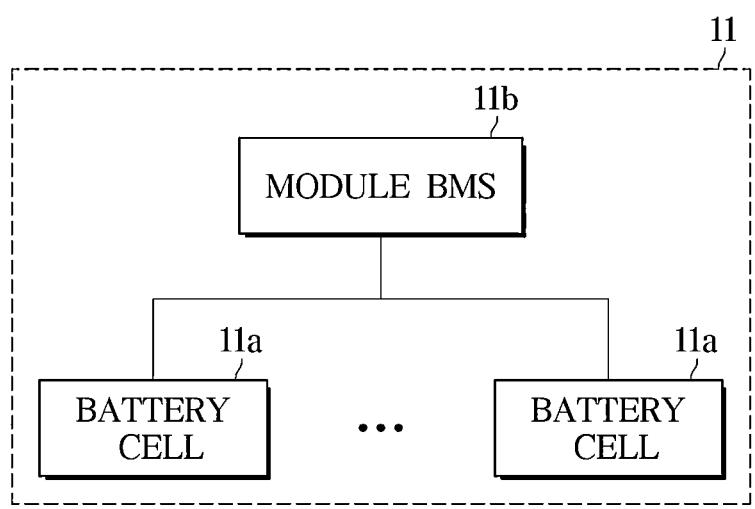
FIG. 1C is a diagram of a battery module of the energy storage system illustrated in FIG. 1B.

FIG. 1A is a diagram of a battery energy storage system according to an embodiment. FIG. 1B is a diagram of a battery rack in the energy storage system illustrated in FIG. 1A. FIG. 1C is a diagram of a battery module of the energy storage system illustrated in FIG. 1B.

An energy storage system 1 is a device that stores energy and outputs the stored energy to be used as needed. For example, the energy storage system 1 may be applied to a new renewable energy technology or a smart grid technology.

As illustrated in FIG. 1A, the energy storage system 1 includes a plurality of battery racks 10 connected in parallel and an energy management system (EMS) 20 configured to manage and control the plurality of battery racks 10.

The energy management system 20 may deliver rack monitoring information such as a charge state and a state of health of each of the battery racks 10 to the battery diagnosis apparatus 1.

As illustrated in FIG. 1B, each of the battery racks 10 includes a plurality of battery modules 11 connected in series and in parallel. The plurality of battery modules 11 may form one of the battery racks 10. Each of the battery racks 10 includes a rack management system (rack BMS) 12 for managing and controlling the plurality of battery modules 11. In the case of a vehicle, the plurality of battery racks 10 may be provided in a battery pack. A plurality of the battery packs 10 connected in series and in parallel is referred to as a battery.

As illustrated in FIG. 1C, each of the battery modules 11 includes a plurality of battery cells 11a connected in series and in parallel. The plurality of battery cells 11a may form one of the battery modules 11.

Each of the battery modules 11 includes a module management system (module BMS) 11b for managing and controlling the plurality of battery cells 11a.

The energy storage system 1 may further include a power converter (not shown) configured to convert power supplied from the outside into power for charging the battery and configured to supply the converted power to the battery. The power supplied from the outside may be power from a power grid.

Figure 2:
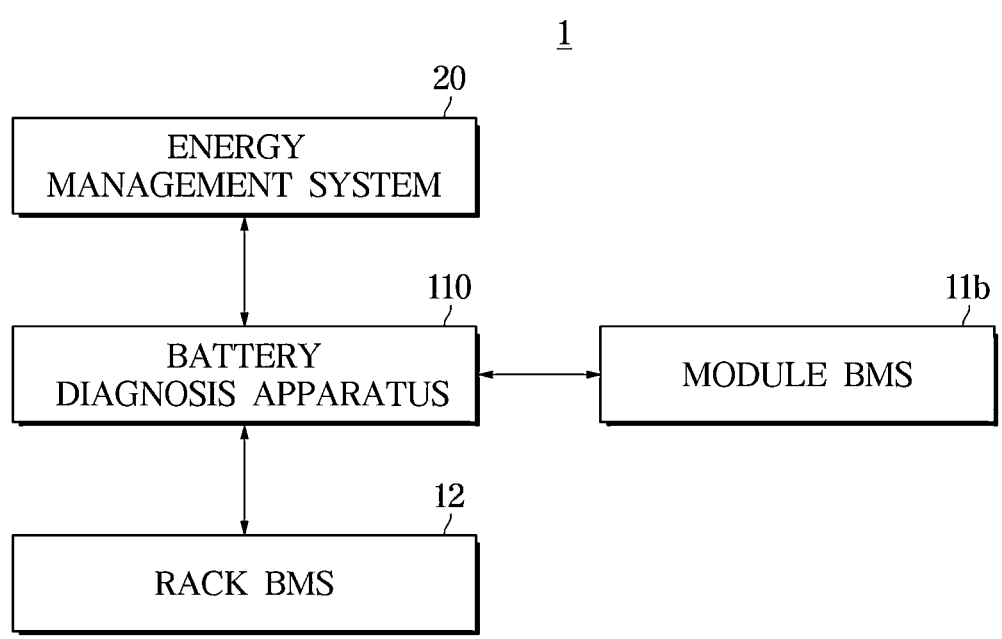
FIG. 2 is a configuration diagram of the energy storage system according to an embodiment.

As illustrated in FIG. 2, the energy storage system 1 may include a battery diagnosis apparatus 110 configured to communicate with at least one of the energy management system 20, the rack management system, i.e., rack BMS 12, or the module management system, i.e., module BMS 11b to monitor and diagnose states of the battery cells 11a, battery modules 11, and battery racks 10 from the respective management systems 11b, 12, and 20.

In other words, the battery diagnosis apparatus 110 receives state information of the battery racks 10 from the energy management system 20, receives status information of the battery modules 11 from the rack management system 12, receives status information of a plurality of battery cells 11a from the module management system 11b, monitors state of the battery cells 11a, battery modules 11, and battery racks 10 based on the received various information, and diagnoses the state of battery cells 11a, battery modules 11, and battery racks 10 based on the monitoring information.

The energy storage system 1 may include a module battery management 11b system configured to manage the battery cells 11a, a rack battery management system 12 configured to manage the battery modules 11, and an energy management system 20 configured to manage the battery racks 10. However, the energy storage system 1 may include a single management system configured to manage the battery cells 11a, battery modules 11, and battery racks 10 by integrating the module battery management system 11b, the rack battery management system 12 and the energy management system 20.

Also, the battery diagnosis apparatus of the energy storage system 1 may monitor and diagnose all of the battery cells 11a, battery modules 11, and battery racks 10 by performing communication with the single management system and receive state information of all of the battery cells 11a, battery modules 11, and battery racks 10 from the single management system.

This battery diagnosis apparatus is described below.

The battery diagnosis apparatus can also monitor and diagnose a battery provided in an eco-friendly vehicle 2.

Figure 3:
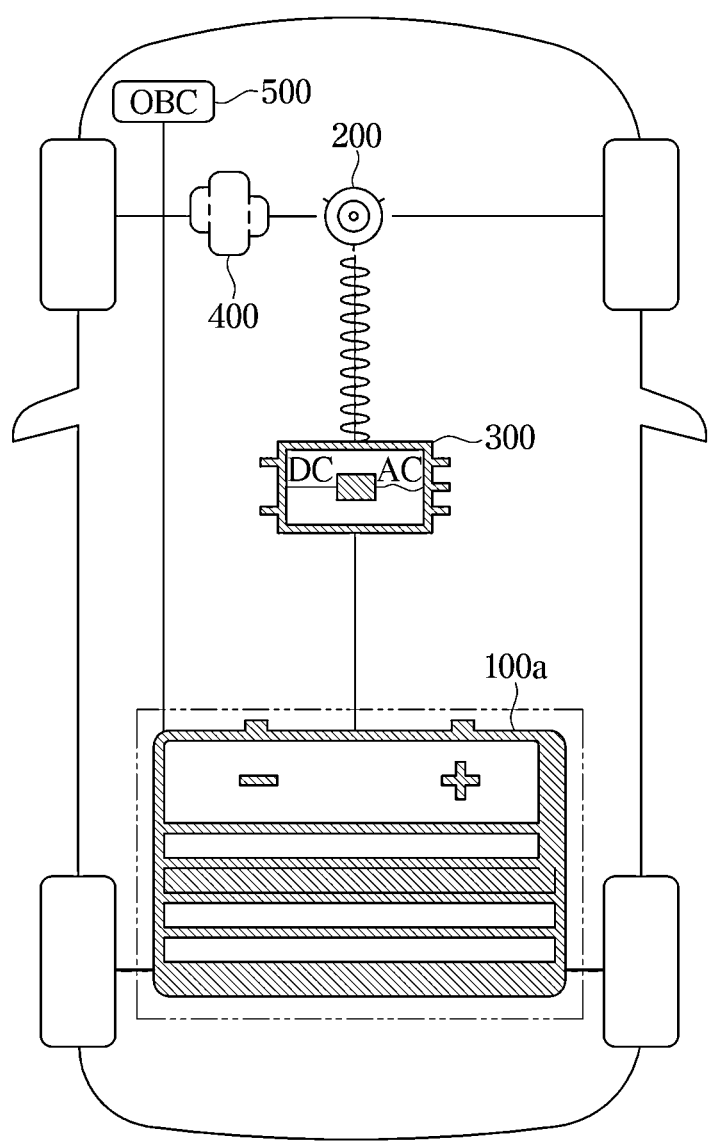
FIG. 3 is a diagram of a vehicle according to an embodiment.

FIG. 3 is a diagram of a vehicle including the battery diagnosis apparatus according to an embodiment.

A vehicle according to the embodiment may be a hybrid vehicle or an electric vehicle as an eco-friendly vehicle. In this embodiment, an electric vehicle is described as an example.

As illustrated in FIG. 3, a power device of the vehicle 2 includes a battery 100a, a motor 200, a motor driving device 300, a speed reducer 400, and a slow charger 500.

The battery 100a may include battery cells 11a provided to supply a driving force to the vehicle 2 by generating a high-voltage current.

The vehicle 2 may further include a fan for lowering a temperature of the battery 100a.

The battery 100a may comprise a plurality of battery packs 10.

Each of the battery packs 10 may comprise a plurality of sub-battery racks connected in series and in parallel, and each of the battery racks 10 may include a plurality of battery modules 11 connected in series and in parallel. In the case of a vehicle, the battery 100a of the rack unit may be omitted. In this case, each of the battery packs 10 may comprise a plurality of battery modules 11 connected in series and in parallel.

Each of the battery modules 11 may include a plurality of battery cells 11a connected in series and in parallel.

A battery cell 11a refers to a basic unit of a battery 100a capable of charging and discharging electrical energy. For example, the battery cell 11a may comprise a positive electrode, a negative electrode, a separator, an electrolyte, and an aluminum case.

Electrical reactions in the positive electrode, negative electrode, separator, and electrolyte of the battery cell 11a are expressed as Ohm resistance, capacitance, and inductance, and chemical (oxidation-reduction) reactions may be expressed as impedances that impede electrical transfer.

The vehicle 2 may further include a power converter (not shown). The power converter converts power supplied from the outside into power for charging the battery 100a and supplies the converted power to the battery 100a. The power supplied from the outside may be power from a charging station or a power grid.

The motor 200 generates a rotational force using electric energy of the battery 100a and transmits the generated rotational force to wheels to drive the wheels.

The motor 200 converts electrical energy of the battery 100a into mechanical energy for operating various devices provided in the vehicle 2.

When a boot button is turned on, the motor 200 is supplied with a maximum current to generate a maximum torque. The motor 200 may operate as a generator under energy regeneration conditions by braking, deceleration, steel plate driving, or low-speed driving to charge a battery 100a of a battery pack 10.

The motor driving device 300 drives the motor 200 in response to a control command from a controller. The motor driving device 300 may include an inverter that converts battery power into driving power of the motor 200.

When driving power of the motor 200 is output, the inverter outputs the driving power of the motor 200 based on a target vehicle speed according to a user command. The driving power of the motor 200 may vary depending on a switching signal for outputting a current corresponding to the target vehicle speed and a switching signal for outputting a voltage corresponding to the target vehicle speed. In other words, the inverter may include a plurality of switching elements.

The inverter may transfer the power generated by the motor 200 to the battery during regenerative braking. In other words, the inverter may perform a function of changing a direction and may output the current between the motor 200 and the battery 100a.

The speed reducer 400 transmits the rotational force obtained by decelerating a speed of the motor 200 and increasing a torque of the motor 200 to the wheels.

The vehicle 2 may further include a charging device provided on the exterior of a vehicle body to which a charging cable is connected and may further include receiving power for charging the battery.

The charging device may include a fast charger for rapidly charging the battery and may include the slow charger 500 for charging the battery at a speed slower than a speed of the fast charger.

A cable for fast charging may be connected to the fast charger, and a cable for slow charging may be connected to the slow charger 500.

In addition, the fast charger for fast charging and the slow charger 500 for slow charging, which has a slower charging speed than the fast charging, may be provided at the same location on the exterior of the vehicle 2 or may be provided at different locations on the exterior of the vehicle 2.

The slow charger 500 converts external commercial power AC into rectification and DC and delivers the converted current to the battery 100a. For example, the slow charger 500 may include an AC rectifier, a power factor correction (PFC), a converter, and a capacitor.

The fast charger may include at least one of a terminal or a cable for directly connecting an external fast charger and the battery 100a.

Figure 4:
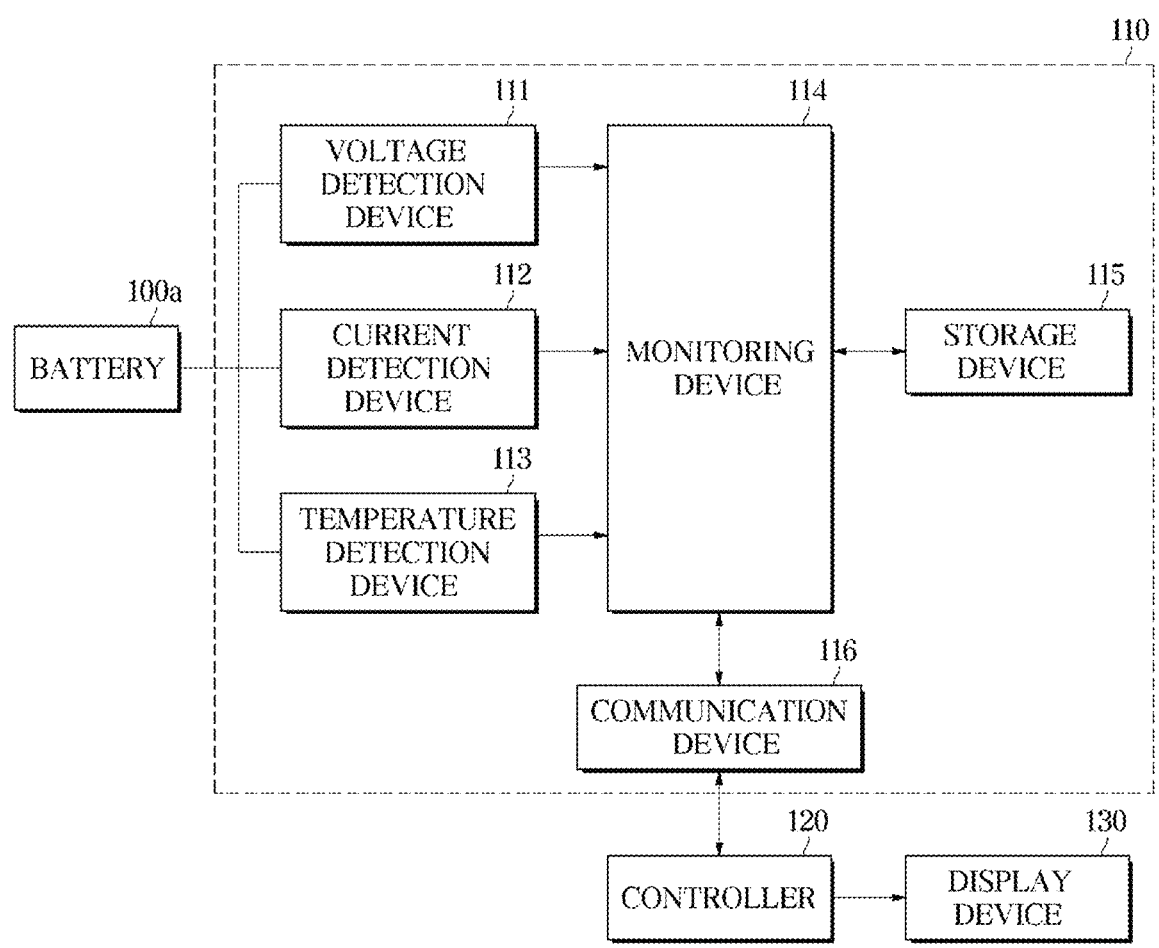
FIG. 4 is a detailed configuration diagram of a battery diagnosis apparatus of the energy storage system according to an embodiment.

FIG. 4 is a control configuration diagram of a battery diagnosis apparatus of the energy storage system according to an embodiment.

As illustrated in FIG. 4, the battery diagnosis apparatus 110 may include a voltage detection device 111, a current detection device 112, a temperature detection device 113, a monitoring device 114, a storage device 115, and a communication device 116.

The battery diagnosis apparatus 110 may be a battery diagnosis apparatus provided in the energy storage system 1 or a battery diagnosis apparatus provided in the vehicle 2. The energy storage system 1 or the vehicle 2 may further include a controller 120 and a display device 130 in addition to the battery diagnosis apparatus 110. The controller 120 and the display device 130 may be provided in the battery diagnosis apparatus 110.

The battery diagnosis apparatus 110 monitors a state of the battery 100a, recognizes a battery cell having a possibility of failure among the plurality of battery cells 11a based on the monitoring result, and outputs information on the recognized battery cell.

The battery diagnosis apparatus 110 may also recognize a battery module having a possibility of failure from among the plurality of battery modules 11 based on the monitoring result, and output information on the recognized battery module.

The battery diagnosis apparatus 110 may also recognize a battery rack having a possibility of failure from among the plurality of battery racks based on the monitoring result, and output information on the recognized battery rack.

The battery diagnosis apparatus 110 may also recognize a battery pack having a possibility of failure from among the plurality of battery packs 10 based on the monitoring result, and output information on the recognized battery pack.

The battery diagnosis apparatus 110 may determine reusability of the battery 100a based on the monitoring information. The monitoring information may include impedance spectrum information and may further include charge state information and aging state information.

A detailed configuration of the battery diagnosis apparatus 110 is described below.

The battery 100a and the battery diagnosis apparatus 110 may be referred to as a battery management system (BMS).

The controller 120 may control an operation of the display device 130 so that state information of the battery 100a transmitted from the battery diagnosis apparatus 110 is output. The controller 120 may control an operation of a sound output device (not shown) so that the state information of the battery 100a transmitted from the battery diagnosis apparatus 110 is output.

The controller 120 may control operations of various electronic devices based on the state information of the battery 100a transmitted from the battery diagnosis apparatus 110. For example, when it is determined that the state information of the battery transmitted from the battery diagnosis apparatus 110 is abnormal information of at least one battery cell, the controller 120 may control an output of abnormal information of the at least one battery cell and cut off power supplied to the various electronic devices.

The controller 120 may control the display of information on the reusability of the battery 100a.

The controller 120 may check an impedance spectrum for each battery cell 11a and control display of identification information for the battery cells 11a having a similar impedance spectrum.

The controller 120 may check an impedance spectrum for each battery module 11 and control display of identification information for the battery modules 11 having a similar impedance spectrum.

The controller 120 may check an impedance spectrum for each battery pack 10 and control display of identification information for the battery packs 10 having a similar impedance spectrum.

This may allow a user to identify the battery cells 11a, battery modules 11, and battery packs 10 with similar impedance spectra.

Similar impedance spectra are those in which an error value for an impedance value for each frequency is within a certain range.

When a plurality of the battery diagnosis apparatuses 110 is provided, the controller 120 may obtain state information of the battery 100a by combining information transmitted from the plurality of battery diagnosis apparatuses 110 and control the output of the obtained battery state information.

The controller 120 may be implemented as a memory (not shown) for storing an algorithm for controlling the operations of the energy storage system 1 or in-vehicle components or storing data for a program reproducing the algorithm and may be implemented as a processor (not shown) for performing the above-described operations using data stored in the memory. In this case, the memory may be implemented as a separate chip from the processor or may be implemented as a single chip with the processor.

The display device 130 displays battery abnormality information in response to a control command of the controller 120. The battery abnormality information may include information on the possibility of a failure.

The display device 130 may display battery management information and may display battery charge state information.

The display device 130 may also display identification information or location information of a battery cell 11a, a battery module 11, or a battery pack 10 in which an abnormality has occurred.

The display device 130 may display battery impedance spectrum information as an image and may display reusability of the battery 100a.

The display device 130 may also display a temperature of the battery 100a.

Hereinafter, the battery diagnosis apparatus 110 is described.

The battery diagnosis apparatus 110 is a detection device that monitors a state of the battery 100a and detects a charge state of the battery 100a in order to diagnose the state of the battery 100a based on the monitoring information. The battery diagnosis apparatus 110 includes the voltage detection device 111 the current detection device 112, and the temperature detection device 113.

The voltage detection device 111 and the current detection device 112 may be detection devices that detect an electrical signal for each battery cell 11a of the battery 100a.

The voltage detection device 111 detects a voltage of the battery 100a and outputs a voltage signal corresponding to the detected voltage.

The voltage detection device 111 may include a resistor divider and may include a voltage sensor.

A plurality of the voltage detection devices 111 may be provided.

The plurality of voltage detection devices 111 may be connected to output terminals of the plurality of battery cells 11a to detect voltages of the plurality of battery cells 11a, respectively.

The plurality of voltage detection devices 111 may be connected to output terminals of the plurality of battery modules 11 to detect voltages of the plurality of battery modules 11, respectively.

The plurality of voltage detection devices 111 may be connected to output terminals of the plurality of battery packs 10 to detect voltages of the plurality of battery packs 10, respectively.

The battery diagnosis apparatus 110 may further include a switch (not shown) connected to the voltage detection device 111. The switch may be selectively connected to the plurality of battery cells 11a. The voltage detection device 111 may detect voltages of the plurality of battery cells 11a, respectively, in response to a change in an on-contact of the switch and may output voltage signals corresponding to the voltages of the detected respective battery cells 11a.

The current detection device 112 detects a current of the battery 100a and outputs a current signal corresponding to the detected current.

The current detection device 112 may include a shunt resistor and may include a current sensor.

A plurality of the current detection devices 112 may be provided.

The plurality of current detection devices 112 may detect currents flowing through the plurality of battery cells 11a, respectively.

The plurality of current detection devices 112 may detect currents flowing through the plurality of battery modules 11, respectively.

The plurality of current detection devices 112 may detect currents flowing through the plurality of battery packs 10, respectively.

The temperature detection device 113 detects a temperature of the battery 100a and outputs a temperature signal for the detected temperature.

The temperature detection device 113 may be provided inside the battery pack 10.

A plurality of the temperature detection devices 113 may be provided.

The plurality of temperature detection devices 113 may be provided in the plurality of battery cells 11a respectively and may detect temperatures of the plurality of battery cells 11a respectively.

The plurality of temperature detection devices 113 may be provided in the plurality of battery modules 1'1 respectively and may detect temperatures of the plurality of battery modules 11 respectively.

The plurality of temperature detection devices 113 may be provided in the plurality of battery packs 10 respectively and may detect temperatures of the plurality of battery packs 10 respectively.

The monitoring device 114 monitors a state of charge of the battery 100a based on the detected current of the battery 100a and diagnoses the state of charge of the battery 100a based on the monitoring information.

The monitoring device 114 may monitor the state of charge of the battery 100a based on the detected current and voltage of the battery 100a.

The monitoring device 114 may monitor the state of charge (SOC) of the battery 100a based on the current, voltage, and temperature of each battery cell 11a of the battery 100a.

The state of charge of the battery 100a may include a charge amount of the battery 100a.

In other words, the monitoring device 114 may obtain the state of charge of the battery 100a corresponding to the current, voltage, and temperature of the battery 100a from a pre-stored table. In the pre-stored table, the charge amount of the battery 100a corresponding to a correlation among the current, voltage, and temperature of the battery 100a may be matched.

The monitoring device 114 may obtain a deterioration rate of the battery 100a based on the temperature of the battery 100a and a charging rate of the battery 100a and may obtain the state of health (SOH or aging state) of the battery 100a based on the obtained deterioration rate of the battery 100a.

The monitoring device 114 may also obtain the deterioration rate of the battery 100a corresponding to a usage period of the battery 100a from information stored in the storage device 115.

The monitoring device 114 may also obtain the deterioration rate of the battery 100a based on a reduced capacity compared to a rated capacity of the battery 100a.

The monitoring device 114 may also obtain an impedance of the battery 100a. The impedance may be obtained in the form of an impedance spectrum, and a configuration of the monitoring device 114 for obtaining the impedance is described below.

The monitoring device 114 may determine whether at least one battery 100a is in the reusable state based on at least one of the voltage, current, temperature, state of charge (SOC), state of health (SOH), or impedance spectrum of the battery and may determine whether the battery 100a is in an abnormal state.

When the monitoring device 114 determines whether the battery 100a is in the reusable state or the abnormal state, the monitoring device 114 may generate an identification signal for managing the state of the battery 100a based on the received detection information and may determine whether the battery 100a is in the reusable state or the abnormal state based on the generated identification signal. The identification signal may be zero (0) or one (1).

When a boot-on command is received from the controller 120, the monitoring device 114 checks the state of charge of the battery, and outputs at least one of charge state information, reusable state information, and abnormal state information for the checked state of charge of the battery to the controller 120.

The monitoring device 114 may be implemented as a memory (not shown) for storing an algorithm for controlling the operations of components in the battery management system (BMS) or storing data for a program reproducing the algorithm and may be implemented as a processor (not shown) for performing the above-described operations using data stored in the memory. In this case, the memory may be implemented as a separate chip from the processor or may be implemented as a single chip with the processor.

The storage device 115 may store a table in which the state of charge of the battery 100a corresponding to a correlation among the current, voltage, and temperature of the battery 100a is matched. The storage device 115 may store a table in which the charge amount of the battery 100a corresponding to the correlation among the current, voltage, and temperature of the battery 100a is matched.

The storage device 115 may store aging state information for each battery cell 11a, may store aging state information for each battery module 11, and may store aging state information for each battery pack 10.

The storage device 115 may store impedance spectrum information for each battery cell 11a, may store impedance spectrum information for each battery module 11, and may store impedance spectrum information for each battery pack 10.

The storage device 115 may be a memory implemented as a chip separate from the processor described above in relation to the monitoring device 114 or may be implemented as a single chip with the processor.

The storage device 115 may be implemented as at least one of a non-volatile memory device such as a cache, a ROM (Read Only Memory), a PROM (Programmable ROM), an EPROM (Erasable Programmable ROM), an EEPROM (Electrically Erasable Programmable ROM), and a flash memory, a volatile memory device such as a RAM (Random Access Memory), or a storage medium such as a HDD (hard disk drive) and a CD-ROM. However, the storage device 115 is not limited thereto.

The communication device 116 communicates with the controller 120 and transmits battery status information to the controller 120.

The communication device 116 may include one or more components that enable communication with the controller 120 and may include, for example, at least one of a short-range communication module, a wired communication module, or a wireless communication module.

The short-range communication module may include various short-range communication modules that transmit and receive signals using a wireless communication network in a short distance such as a Bluetooth module, an infrared communication module, an RHO (Radio Frequency Identification) communication module, a WLAN (Wireless Local Access Network) communication module, an NFC communication module, and a Zigbee communication module.

The wired communication module may include various wired communication modules such as a CAN (Controller Area Network) communication module, a LAN (Local Area Network) module, a WAN (Wide Area Network) module, or a VAN (Value Added Network) module, as well as various cable communication modules such as a USB (Universal Serial Bus), an HDMI (High Definition Multimedia Interface), a DVI (Digital Visual Interface), an RS-232 (recommended standard 232), power line communication, and a POTS (plain old telephone service).

The wireless communication module, in addition to the Wi-Fi module and the wireless broadband module, may include wireless communication modules supporting various wireless communication methods such as a GSM (Global System for Mobile Communication), a COMA (Code Division Multiple Access), a WCDMA (Wideband Code Division Multiple Access), a UMTS (Universal Mobile Telecommunications System), a TDMA (Time Division Multiple Access), and LTE (Long Term Evolution).

At least one component may be added or deleted depending on the performance of the components of the battery management system illustrated in FIG. 4. In addition, it should be readily understood by those of ordinary skill in the art that the mutual positions of the components may be changed depending on the performance or structure of the system.

The respective components illustrated in FIG. 4 mean software and/or hardware components such as field programmable gate arrays (FPGA) and application specific integrated circuits (ASIC).

Figure 5:
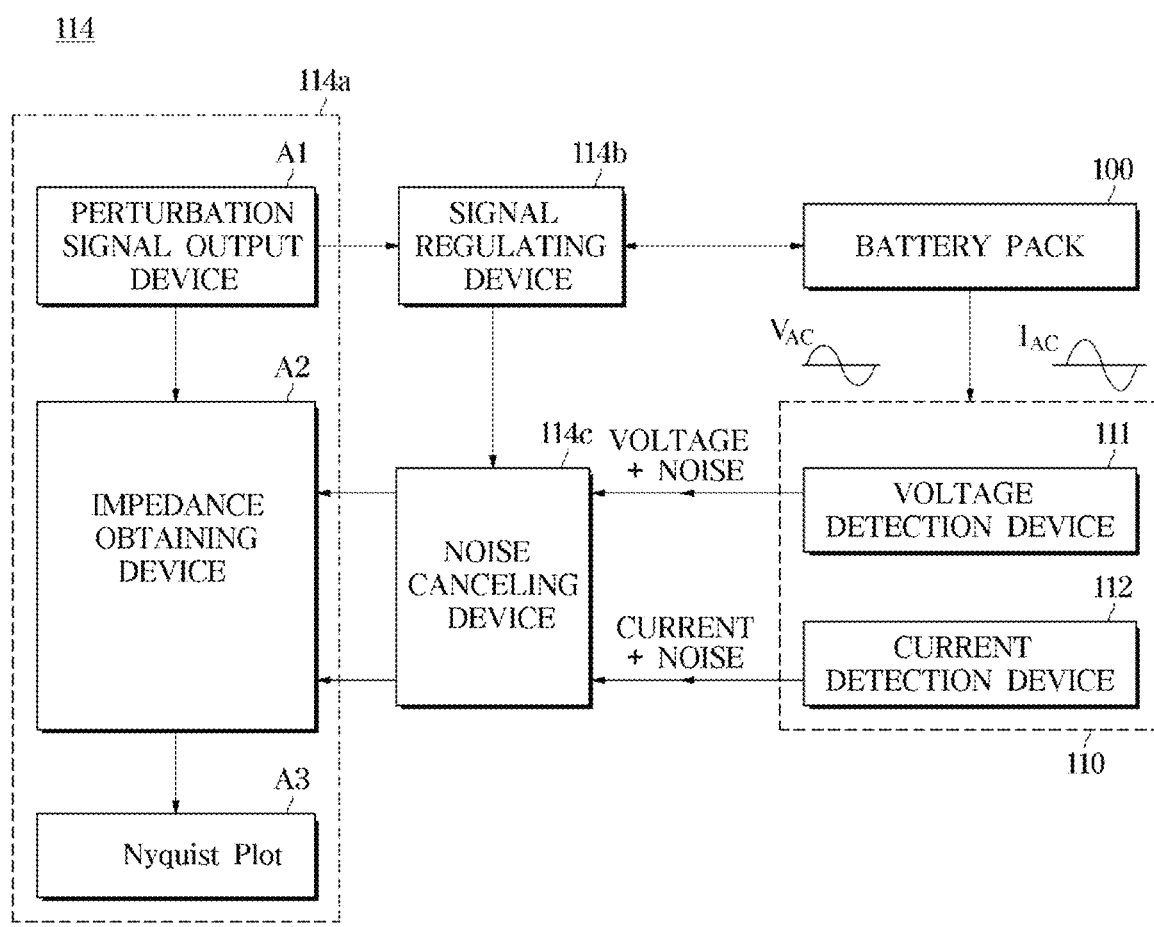
FIG. 5 is a detailed configuration diagram of a monitoring device of the battery diagnosis apparatus of the energy storage system according to an embodiment.

FIG. 5 is a configuration diagram of a monitoring device of the battery diagnosis apparatus according to an embodiment.

As illustrated in FIG. 5, the monitoring device 114 includes a data obtaining device 114a and a signal regulating device 114b for obtaining an impedance spectrum of at least one of at least one battery cell 11a, battery module 11, and battery pack 10. In this embodiment, an example of obtaining an impedance spectrum of the battery pack 10 is described.

The data obtaining device 114a measures, collects, and processes data about the voltage and current of the battery pack 10.

The data obtaining device 114a generates a perturbation signal of a voltage lower than a preset voltage and generates a plurality of perturbation signals having different frequency magnitudes. The perturbation signal of a voltage lower than the preset voltage may be a voltage signal.

The data obtaining device 114a may generate a perturbation signal of a sinusoidal waveform while changing the frequency.

The data obtaining device 114a includes a perturbation signal output device A1 for outputting a perturbation signal for each frequency to the signal regulating device 114b. The perturbation signal output device A1 may include a digital-to-analog converter (D/A) for converting a digital signal into an analog signal.

The data obtaining device 114a includes an impedance obtaining device A2 for obtaining an impedance based on an alternating current component of current and an alternating current component of voltage.

The impedance obtaining device A2 may receive noise-canceled current signal and voltage signal from a noise canceling device 114c and may convert the received current signal and voltage signal into digital data. The noise-canceled current signal and voltage signal may be voltage and current response signals due to perturbation.

The noise-canceled current signal and voltage signal may be signals including the alternating current component.

The impedance obtaining device A2 may include an analog-to-digital converter (A/D) configured to convert a signal of a current including the alternating current component into a digital signal and convert a signal of a voltage including the alternating current component into a digital signal.

The impedance obtaining device A2 may obtain data on the voltage and current of the battery pack 10 from the digital signal.

The data obtaining device 114a shows an imaginary reactance of the impedance on a y-axis and a real resistance of the impedance on an x-axis using a Nyquist Plot. In this case, a frequency representing the maximum of an impedance value of a semicircle appearing on the x-axis and the y-axis corresponds to a reciprocal number of a time constant of a circuit.

The signal regulating device 114b amplifies the perturbation signal received from the data obtaining device 114a and applies the amplified perturbation signal to the battery pack.

The amplified perturbation signal may be a perturbation signal of the current, and the perturbation signal of the current may be applied to the battery pack 10. In this case, the battery pack 10 may output a current and a current response signal for the perturbation signal of the current. The voltage and current response signals output from the battery pack 10 may be detected through the voltage detection device and the current detection device.

The signal regulating device 114b generates a feedback signal for a current signal (i.e., a current response signal) received from the battery pack 10 and transmits the generated feedback signal to the data obtaining device 114a.

The signal regulating device 114b may generate a perturbation signal of the current using the feedback signal. The signal regulating device 114b may include a current sink for generating a perturbation signal of the current.

The current perturbation signal may be a current signal (a response signal) obtained by applying a perturbation signal equal to or less than the preset voltage to the battery pack 10.

The signal regulating device 114b may generate a current through feedback through a turn-on operation of the switch and may limit the current to prevent the occurrence of overcurrent in the battery pack 10. The signal regulating device 114b may perform a stable feedback.

The switch may be a switch capable of perturbation even under a high voltage of the battery pack 10.

The high voltage of the battery pack 10 may be a voltage greater than or equal to a predetermined voltage.

The switch may cause the battery pack 10 to perturb by discharging the battery pack 10 for a reference period of time. The switch may induce current perturbation in the battery pack 10.

The noise canceling device 114c may include four terminals for receiving a voltage response signal and a current response signal and outputting a voltage feedback signal and a current feedback signal.

By using only four terminals, an influence on a resistance of a probe terminal may be reduced, and thus impedance obtainment accuracy may be improved.

The noise canceling device 114c may include first and second high-pass filters for canceling a direct current (DC) component, a buffer for a signal stability, and first and second low-pass filters for canceling high-frequency noise. The low-pass filters may be of an active type.

The noise canceling device 114c detects only the alternating current (AC) component in the perturbed voltage signal and current signal. The perturbed voltage signal and current signal may be the voltage response signal and the current response signal of the battery pack.

The noise canceling device 114c may include a voltage noise canceling device for canceling noise in the voltage response signal through feedback and may include a current noise canceling device for canceling noise in the current response signal through feedback. The noise canceling device 114c transmits the noise-canceled voltage signal and current signal to the impedance obtaining device A2.

Figure 6:
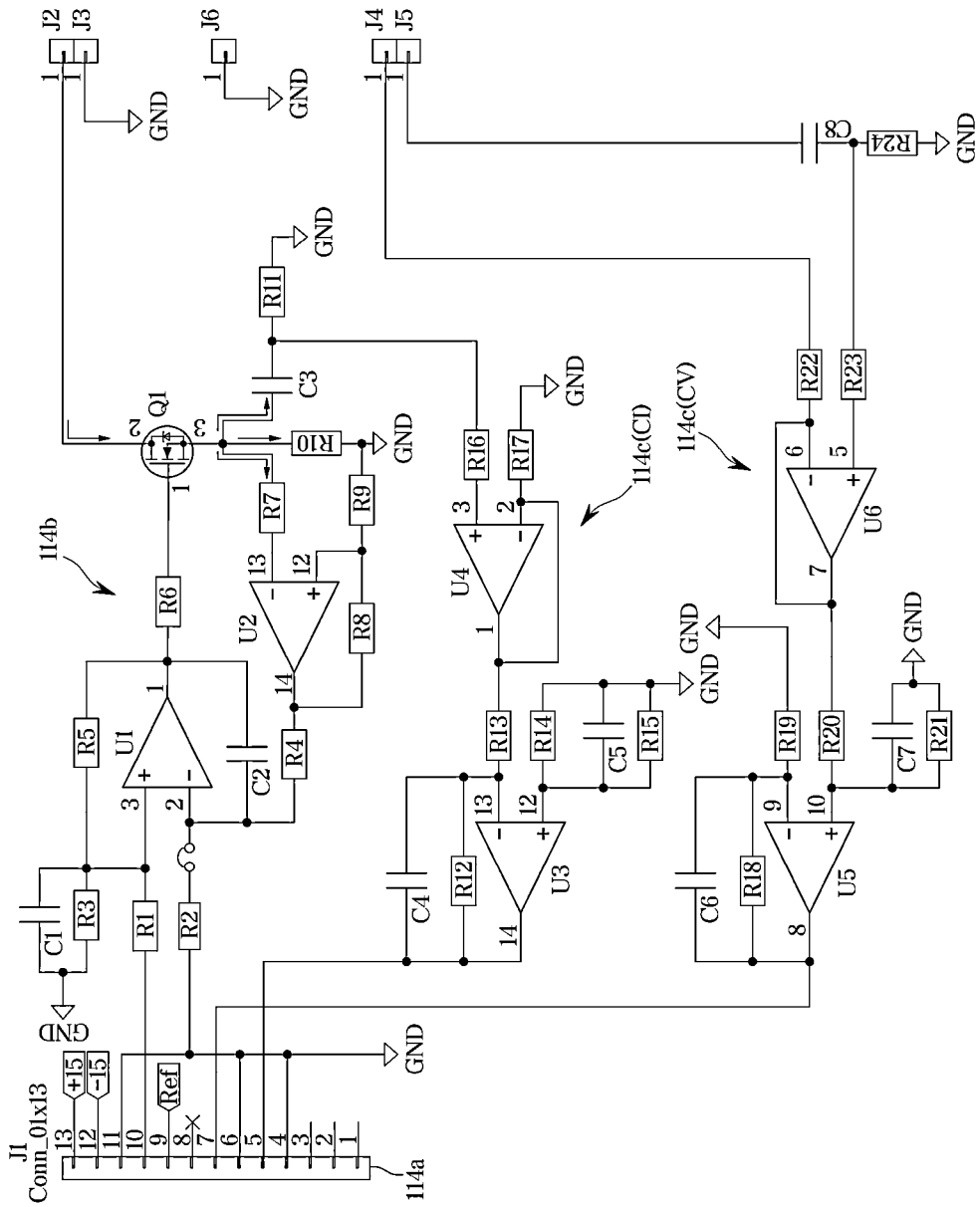
FIG. 6 is a circuit diagram of the monitoring device in the battery diagnosis apparatus according to an embodiment.
Figure 7A:
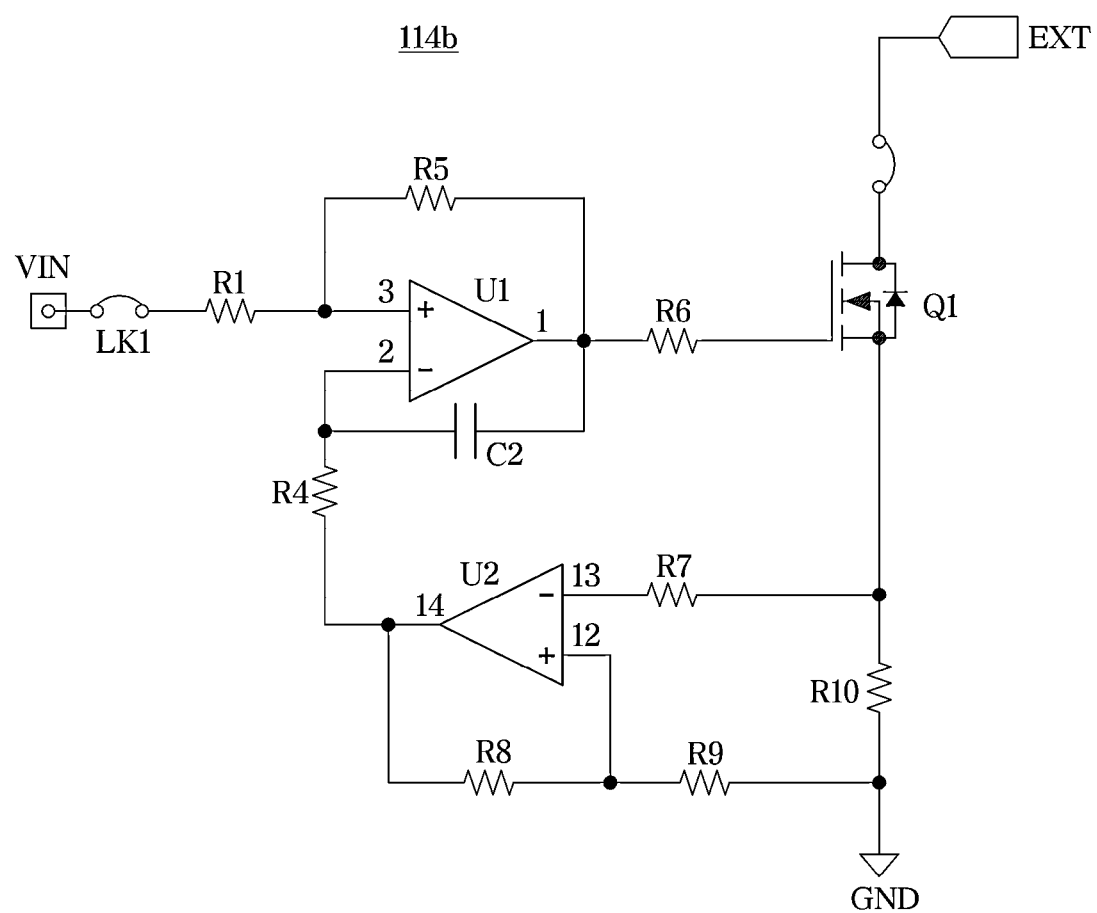
FIG. 7A is a detailed circuit diagram of a signal regulating device of the monitoring device illustrated in FIGS. 6, and 7B and 7C are detailed circuit diagrams of a noise canceling device of the monitoring device illustrated in FIG. 6.
Figure 7B:
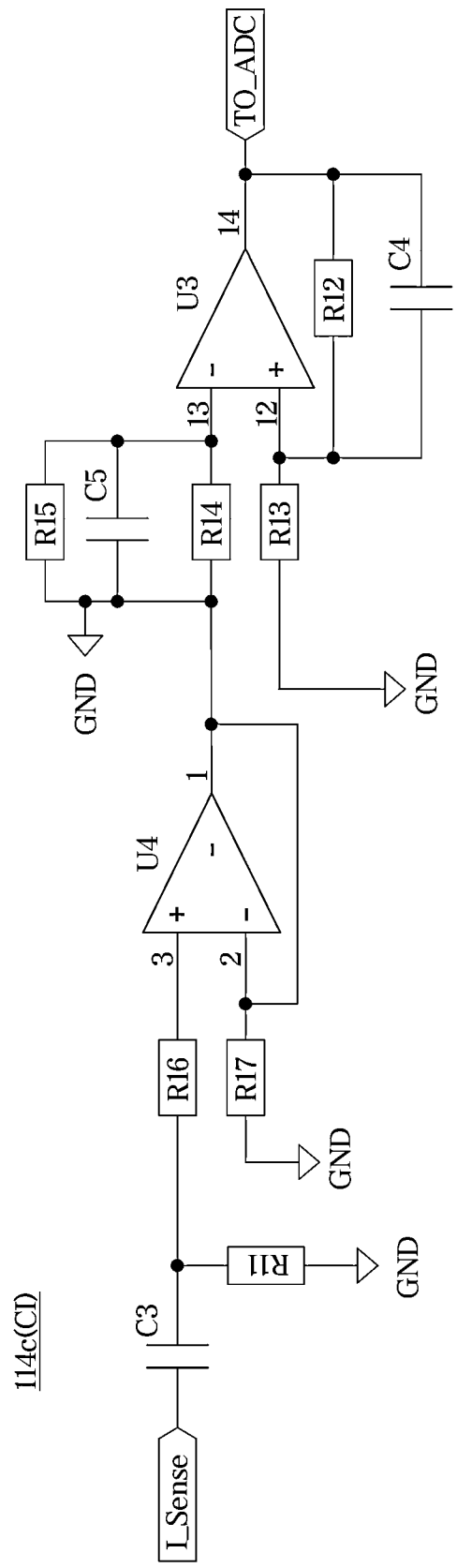
Figure 7C:
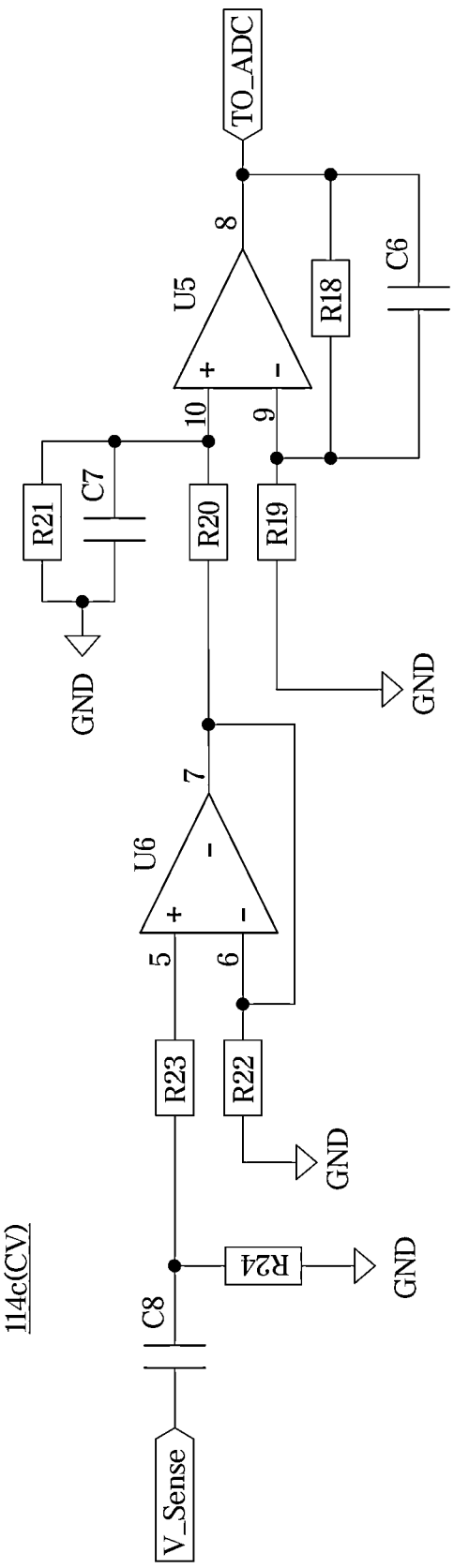

FIG. 6 is a circuit diagram of the monitoring device in the battery diagnosis apparatus according to an embodiment, and hereinafter a circuit of the monitoring device is described with reference to FIGS. 7A, 7B, and 70. FIG. 7A is a detailed circuit diagram of the signal regulating device 114b of the monitoring device illustrated in FIG. 6, and FIGS. 7B and 7C are detailed circuit diagrams of the noise canceling device 114c of the monitoring device illustrated in FIG. 6

The signal regulating device 114b includes a first amplifier U1 and a second amplifier U2, includes a plurality of resistors R1 to R11 and a plurality of capacitors C1 to C3, and includes a switch Q1.

As illustrated in FIG. 7A, the signal regulating device 114b includes the first resistor R1 connected to the data obtaining device 114a to receive a perturbation signal for each frequency and the first amplifier U1 having a non-inverting terminal connected to the first resistor R1. The signal regulating device 114b also includes the fourth resistor R4 connected between an inverting terminal of the first amplifier U1 and an output terminal of the second amplifier U2. The signal regulating device 114b also includes the second capacitor C2 connected between an output terminal of the first amplifier U1 and the fourth resistor R4. The signal regulating device 114b also includes the fifth resistor R5 connected between the non-inverting terminal of the first amplifier U1 and the output terminal of the first amplifier U1. The signal regulating device 114b also includes the sixth resistor R6 connected between the output terminal of the first amplifier U1 and a gate terminal of the switch Q1. The signal regulating device 114b also includes the switch Q1 having a drain terminal connected to the battery pack 10.

The first amplifier U1 amplifies the received perturbation signal. The first amplifier U1 converts a voltage signal, which is the perturbation signal, into a current signal. In this case, the perturbation signal of the converted current may be applied to the battery pack 10. In this case, the voltage and current response signals responded in the battery pack may be detected through the respective detection devices. For example, the voltage may be detected through a divider resistor, and the current may be detected through a shunt resistor. The tenth resistor R10 may be the shunt resistor.

The voltage and current response signals detected as described above may be transmitted to the data obtaining device 114a of the monitoring device through the noise canceling device 114c.

The first amplifier U1 causes the switch Q1 to perform the turn-on operation and generates a current through feedback.

The switch Q1 may include an n-channel MOSFET.

The switch Q1 is a gate-source voltage, a current flows from the drain terminal to a source terminal when a voltage greater than or equal to a threshold value is applied to the switch Q1, and no current flows when the gate-source voltage is below the threshold value. Accordingly, the switch Q1 may be turned on when the perturbation signal is received through the first amplifier U1.

The switch Q1 may be operated under the voltage of the battery pack 10 and induces a current perturbation of the battery pack 10.

By the turn-on operation of the switch Q1, the current of the battery pack 10 may flow to the second amplifier U2 through the seventh resistor R7, the tenth resistor R10, and the ninth resistor R9 and may flow to a fourth amplifier U4 through the third capacitor C3 and a sixteenth resistor R16.

The signal regulating device 114b includes the seventh resistor R7 connected to the source terminal of the switch Q1 and an inverting terminal of the second amplifier U2. The signal regulating device 114b also includes the eighth resistor R8 connected between a non-inverting terminal of the second amplifier U2 and the output terminal of the second amplifier U2. The signal regulating device 114b also includes the ninth resistor R9 connected between the non-inverting terminal of the second amplifier U2 and a ground GND. The signal regulating device 114b also includes the tenth resistor R10 connected between the source terminal of the switch Q1 and the ground GND.

The second amplifier U2 limits the current to prevent overcurrent from occurring in the battery pack 10, thereby stabilizing the perturbation signal and the feedback signal.

The current noise canceling device CI of the noise canceling device 114c for canceling the noise of the current includes a third amplifier U3 and the fourth amplifier U4 and includes a plurality of resistors R12 to R17 and a plurality of capacitors C4 and C5.

As illustrated in FIG. 7B, the current noise canceling device CI may include a current signal receiving terminal I_sense for receiving a current signal detected by the shunt resistor or the like. The current noise canceling device CI may also include the third capacitor C3 connected to the current signal receiving terminal (I_sense) and the eleventh resistor R11 connected between the third capacitor C3 and the ground GND. The current noise canceling device CI may also include the sixteenth resistor R16 connected between the third capacitor C3 and a non-inverting terminal of the fourth amplifier U4. The current noise canceling device CI may also include the seventeenth resistor R17 connected between an inverting terminal of the fourth amplifier U4 and the ground GND.

The non-inverting terminal of the fourth amplifier U4 and an output terminal of the fourth amplifier U4 may be connected to each other.

The fourth amplifier U4 may be a buffer for a signal stability. The fourth amplifier U4 may be a unity gain buffer.

The fourth amplifier U4 may invert and output the received current signal.

The third capacitor C3 and the eleventh resistor R11 may be the first high-pass filter for canceling the DC component of the received current signal.

The current noise canceling device CI includes the twelfth resistor R12 and the fourth capacitor C4 connected in parallel between a non-inverting terminal of the third amplifier U3 and an output terminal of the third amplifier U3. The current noise canceling device CI also includes the thirteenth resistor R13 connected between a non-inverting terminal of the third amplifier U3 and the ground GND. The current noise canceling device CI also includes the fourteenth resistor R14 connected between the output terminal of the fourth amplifier U4 and the inverting terminal of the third amplifier U3. The current noise canceling device CI also includes the fifteenth resistor R15 and the fifth capacitor C5 connected between the output terminal of the fourth amplifier U4 and the inverting terminal of the third amplifier U3 and connected in parallel to each other to the fourteenth resistor R14.

The fourteenth resistor R14, the fifteenth resistor R15, the twelfth resistor R12, and the fourth and fifth capacitors C4 and C5 may be the first low-pass filter for canceling a high-frequency noise signal.

The third amplifier U3 may invert the signal output from the fourth amplifier U4.

The output terminal of the third amplifier U3 may be connected to the impedance obtaining device A2 of the data obtaining device 114a to transmit a noise-canceled current signal to the impedance obtaining device A2.

The voltage noise canceling device CV of the noise canceling device 114c for canceling the noise of the voltage includes a fifth amplifier U5 and a sixth amplifier U6 and includes a plurality of resistors R18 to R24 and a plurality of capacitors C6, C7, and C8.

As illustrated in FIG. 7C, the voltage noise canceling device CV may include a voltage signal receiving terminal V_sense for receiving a voltage signal detected by a divider resistor or the like and the eighth capacitor C8 connected to the voltage signal receiving terminal V_sense. The voltage noise canceling device CV may also include the twenty-fourth resistor R24 connected between the eighth capacitor C8 and the ground GND and the twenty-third resistor R23 connected between the eighth capacitor C8 and a non-inverting terminal of the sixth amplifier U6. The voltage noise canceling device CV may also include the twenty-second resistor R22 connected between an inverting terminal of the sixth amplifier U6 and the ground GND.

The non-inverting terminal of the sixth amplifier U6 and an output terminal of the sixth amplifier U6 may be connected.

The eighth capacitor C8 and the twenty-fourth resistor R24 may be the second high-pass filter for canceling the DC component of the received voltage signal.

The sixth amplifier U6 may be a buffer for a signal stability. The sixth amplifier U6 may be a unity gain buffer.

The voltage noise canceling device CV includes the twentieth resistor R20 connected between a non-inverting terminal of the fifth amplifier U5 and the output terminal of the sixth amplifier U6. The voltage noise canceling device CV also includes the twenty-first resistor R21 and the seventh capacitor C7 connected in parallel with each other between the ground and a contact. The contact is disposed between the non-inverting terminal of the fifth amplifier U5 and the twentieth resistor R20. The voltage noise canceling device CV includes the eighteenth resistor R18 and the sixth capacitor C6 connected in parallel to each other between an output terminal of the fifth amplifier U5 and an inverting terminal of the fifth amplifier U5.

The twenty-first resistor R21, the eighteenth resistor R18, and the sixth and seventh capacitors C6 and C7 may be the second low-pass filter for canceling a high-frequency noise signal among voltage signals.

The fifth amplifier U5 may invert the signal output from the sixth amplifier U6.

The output terminal of the fifth amplifier U5 may be connected to the impedance obtaining device A2 of the data obtaining device 114a to transmit a noise-canceled voltage signal to the impedance obtaining device A2.

Figure 8:
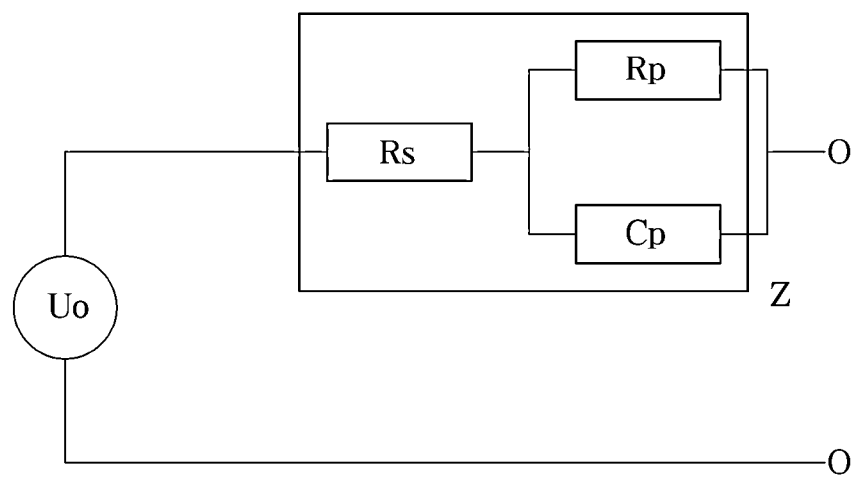
FIG. 8 is a diagram of an impedance model for obtaining an impedance spectrum from a data obtaining device of the battery diagnosis apparatus according to an embodiment.

FIG. 8 is a diagram of an impedance model for obtaining an impedance spectrum from a data obtaining device of the battery diagnosis apparatus according to an embodiment.

The impedance obtaining device A2 obtains information on the impedance spectrum based on the data on the voltage and current of the battery pack converted into a digital signal.

The impedance obtaining device A2 obtains the amplitude and phase values of the noise-canceled voltage signal and current signal as impedance.

The magnitude and phase values of the noise-canceled voltage signal and current signal may be expressed by real and imaginary components.

The impedance model can be expressed by an internal resistance (Ohm) Rs of the battery pack 10, an electrochemical reaction rate Rp in the battery, and a capacitor function Op by an electric double layer between the electrode and the electrolyte. A total impedance Z of the battery pack 10 may include the internal resistance Rs, the reaction rate Rp, and the capacitor function Op and is divided into a real number R_real and an imaginary number R_imag.

The internal resistance Rs becomes a criterion for the state of health (SoH) of the battery pack. The reaction rate Rp and the capacitor function Op become the criteria for the state of charge (SoC) of the battery pack. The direct current (DO) resistance Rp becomes a criterion for determining a deepening of the discharge.

A Nyquist diagram may be obtained by applying an electrical model to the impedance of the battery pack that varies with frequency. A damaged battery may be picked from a frequency-dependent impedance spectrum obtained from the Nyquist diagram.

The data obtaining device may quickly evaluate the state of the battery pack 10 by obtaining the impedance spectrum according to frequency through a Nyquist plot. For example, AC characteristics measured at a frequency of about 1 kHz may be used to evaluate the aging state of the battery 100a, and DC characteristic measured at a low frequency (about 1 Hz) may be used to evaluate the state of charge of the battery 100a.

The battery diagnosis apparatus 110 according to the disclosure may measure the AC impedance spectrum of the battery in a frequency range of 1 Hz to 1 kHz and a maximum voltage of 800 V through a perturbation current of 250 mAp-p. Through this, the battery diagnosis apparatus 110 according to the disclosure may effectively monitor the state of the battery.

Herein, the disclosed embodiments may be implemented in the form of a recording medium storing instructions executable by a computer. The instructions may be stored in the form of program code, and when executed by a processor, a program module may be created to perform the operations of the disclosed embodiments. The recording medium may be implemented as a computer-readable recording medium.

The computer-readable recording medium includes various kinds of recording media in which instructions which may be decrypted by a computer are stored. For example, there may be a ROM (Read Only Memory), a RAM (Random Access Memory), a magnetic tape, a magnetic disk, a flash memory, an optical data storage device, and the like.

As is apparent from the above, a battery diagnosis apparatus 110 according to the disclosure can measure an impedance spectrum of a battery 100a by using power supplied through a USB port and a high voltage MOSFET without using a separate power supply device.

Further, the battery diagnosis apparatus 110 according to the disclosure can measure an AC impedance spectrum of a battery with a frequency range of 1 Hz to 1 kHz and a maximum voltage of 800 V through a perturbation current of 250 mAp-p. With this, the battery diagnosis apparatus 110 according to the disclosure can effectively diagnose a battery condition. The battery diagnosis apparatus 110 according to the disclosure can measure a remaining life of the battery 100a through the battery diagnosis and prevent failures by diagnosing the battery condition.

Further, the battery diagnosis apparatus 110 according to the disclosure can inspect the quality of batteries on a line for producing battery cells 11a, battery modules 11, and battery packs 10. The battery diagnosis apparatus 110 according to the disclosure can measure an impedance spectrum of a battery 100a in a site for reuse of waste batteries, so that a time for dismantling the battery 100a, manpower and logistics cost can be reduced, a purchase cost of foreign-made equipment can be reduced, and a cost and manpower for replacement with foreign-made equipment can be reduced.

Further, the battery diagnosis apparatus 110 according to the disclosure can improve quality and marketability, can increase user satisfaction, can improve user convenience, reliability and safety, and further can secure product competitiveness.

The embodiments disclosed with reference to the accompanying drawings have been described above. However, it should be understood by those having ordinary skill in the art that various changes in form and details may be made therein without departing from the spirit and scope of the disclosure as defined by the appended claims. The disclosed embodiments are illustrative and should not be construed as limiting.

What is claimed is:

1. A battery diagnosis apparatus comprising:
   a data obtaining device configured to output a perturbation signal;
   a signal regulating device configured to generate a current by applying the perturbation signal to a battery and performing feedback of a current signal output from the battery; and
   a noise canceling device configured to cancel noises of the current signal and a voltage signal received from the battery,
   wherein the data obtaining device outputs the perturbation signal while changing a frequency, obtains an impedance spectrum based on the noise-canceled current signal and voltage signal for each frequency, and determines whether to reuse the battery based on the obtained impedance spectrum, and wherein the signal regulating device comprises:
a first amplifier provided to amplify the perturbation signal;
a switch provided to be turned on by the amplified perturbation signal and induce a current of the battery; and
a second amplifier provided to feed back a current signal for the induced current of the battery to the first amplifier.

2. The battery diagnosis apparatus according to claim 1, wherein the switch comprises an n-channel MOSFET.

3. The battery diagnosis apparatus according to claim 2, wherein the data obtaining device controls a discharging of the battery for a preset time by turning on the switch for a preset time.

4. The battery diagnosis apparatus according to claim 1, further comprising:
a current detection device configured to detect a current flowing through the battery and transmit the detected current to the noise canceling device; and
a voltage detection device configured to detect a voltage applied to the battery and transmit the detected voltage to the noise canceling device.

5. The battery diagnosis apparatus according to claim 4, wherein the noise canceling device comprises:
a current noise canceling device configured to cancel a noise from a current signal for the current detected by the current detection device and transmit the noise-canceled current signal to the data obtaining device; and
a voltage noise canceling device configured to cancel a noise from a voltage signal for the voltage detected by the voltage detection device and transmit the noise-canceled voltage signal to the data obtaining device.

6. The battery diagnosis apparatus according to claim 5, wherein the current noise canceling device comprises:
a first high-pass filter provided to cancel a DC component of a current signal for the current detected by the current detection device; and
a first low-pass filter provided to cancel a high-frequency noise in the current signal in which the DC component is canceled, and
wherein the voltage noise canceling device comprises:
a second high-pass filter provided to cancel a DC component of a voltage signal for the voltage detected by the voltage detection device; and
a second low-pass filter provided to cancel a high-frequency noise in the voltage signal in which the DC component is canceled.

7. The battery diagnosis apparatus according to claim 6, wherein the current noise canceling device comprises:
a third amplifier connected to the first low-pass filter; and
a fourth amplifier connected to the first high-pass filter and provided to invert the current signal from which the DC component is canceled and transmit the inverted current signal to the third amplifier, and
wherein the voltage noise canceling device comprises:
a fifth amplifier connected to the second low-pass filter; and
a sixth amplifier connected to the second high-pass filter and provided to invert the voltage signal from which the DC component is canceled and transmit the inverted voltage signal to the fifth amplifier.

8. The battery diagnosis apparatus according to claim 7, wherein
the third amplifier inverts the signal transmitted from the fourth amplifier and transmits the inverted signal to the data obtaining device, and
the fifth amplifier inverts the signal transmitted from the sixth amplifier and transmits the inverted signal to the data obtaining device.

9. The battery diagnosis apparatus according to claim 5, wherein the data obtaining device comprises an analog-to-digital converter provided to convert the noise-canceled voltage signal and the noise-canceled current signal into a digital signal.

10. The battery diagnosis apparatus according to claim 1, wherein the data obtaining device outputs a perturbation signal of a voltage converted into an analog signal.

11. The battery diagnosis apparatus according to claim 1, wherein the data obtaining device displays information on the impedance spectrum through a Nyquist plot.

12. A battery diagnosis apparatus comprising:
a current detection device configured to detect a current flowing through a battery;
a voltage detection device configured to detect a voltage applied to the battery;
a monitoring device configured to apply a perturbation signal of the voltage to the battery, generate a perturbation signal of the current by performing feedback of a current signal output from the battery, cancel noises of a current signal for the current detected by the current detection device and a voltage signal for the voltage detected by the voltage detection device, and obtain an impedance spectrum based on the noise-canceled current signal and voltage signal;
a controller configured to determine whether to reuse the battery based on the obtained impedance spectrum; and
a display device configured to display a Nyquist plot for the obtained impedance spectrum and information on whether to reuse the battery,
wherein the monitoring device comprises:
a first amplifier provided to amplify the perturbation signal of the voltage;
a switch provided to be turned on by the amplified perturbation signal and induce a current of the battery; and
a second amplifier provided to feed back a current signal for the induced current of the battery to the first amplifier.

13. The battery diagnosis apparatus according to claim 12, wherein the monitoring device comprises:
a data obtaining device configured to output the perturbation signal of the voltage while changing a frequency and obtain an impedance spectrum based on the noise-canceled current signal and voltage signal.

14. The battery diagnosis apparatus according to claim 13, wherein the monitoring device comprises:
a current noise canceling device configured to cancel a noise from a current signal for the current detected by the current detection device and transmit the noise-canceled current signal to the data obtaining device; and
a voltage noise canceling device configured to cancel a noise from a voltage signal for the voltage detected by the voltage detection device and transmit the noise-canceled voltage signal to the data obtaining device.

15. The battery diagnosis apparatus according to claim 14, wherein the current noise canceling device comprises:
- a first high-pass filter provided to cancel a DC component of a current signal for the current detected by the current detection device; and
- a first low-pass filter provided to cancel a high-frequency noise in the current signal in which the DC component is canceled, and wherein the voltage noise canceling device comprises:
- a second high-pass filter provided to cancel a DC component of a voltage signal for the voltage detected by the voltage detection device; and
- a second low-pass filter provided to cancel a high-frequency noise in the voltage signal in which the DC component is canceled.

16. The battery diagnosis apparatus according to claim 15, wherein the current noise canceling device comprises:
- a third amplifier connected to the first low-pass filter; and
- a fourth amplifier connected to the first high-pass filter and provided to invert the current signal from which the DC component is canceled and transmit the inverted current signal to the third amplifier, and wherein the voltage noise canceling device comprises:
- a fifth amplifier connected to the second low-pass filter; and
- a sixth amplifier connected to the second high-pass filter and provided to invert the voltage signal from which the DC component is canceled and transmit the inverted voltage signal to the fifth amplifier.

17. The battery diagnosis apparatus according to claim 16, wherein
- the third amplifier inverts the signal transmitted from the fourth amplifier and transmits the inverted signal to the data obtaining device, and
- the fifth amplifier inverts the signal transmitted from the sixth amplifier and transmits the inverted signal to the data obtaining device.

* * * * *